(12) United States Patent
Yun et al.

(10) Patent No.: US 9,310,697 B2
(45) Date of Patent: Apr. 12, 2016

(54) DIGITAL EXPOSURE DEVICE USING DIGITAL MICRO-MIRROR DEVICE AND A METHOD FOR CONTROLLING THE SAME

(71) Applicant: SAMSUNG DISPLAY CO., LTD., Yongin, Gyeonggi-Do (KR)

(72) Inventors: Sanghyun Yun, Suwon-si (KR); Cha-Dong Kim, Seoul (KR); Changhoon Kim, Asan-si (KR); Jung-In Park, Seoul (KR); Kibeom Lee, Seoul (KR); Hikuk Lee, Yongin-si (KR); Jaehyuk Chang, Seongnam-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 281 days.

(21) Appl. No.: 14/141,147

(22) Filed: Dec. 26, 2013

(65) Prior Publication Data

US 2015/0015859 A1  Jan. 15, 2015

(30) Foreign Application Priority Data

Jul. 9, 2013 (KR) ........................ 10-2013-0080436

(51) Int. Cl.
*G03B 27/44* (2006.01)
*G03B 27/54* (2006.01)
*G03F 7/20* (2006.01)

(52) U.S. Cl.
CPC .......... *G03F 7/70291* (2013.01); *G03F 7/2051* (2013.01); *G03F 7/70208* (2013.01); *G03F 7/70275* (2013.01)

(58) Field of Classification Search
CPC ... G03F 7/2041; G03F 7/2057; G03F 7/2083; G03F 7/70291; G03F 7/70375; G03F 7/70383; G03F 7/70075; G03F 7/70183; G03F 7/70208; G03F 7/70275; G03F 7/70475; G03F 7/70558
USPC ................. 355/46, 52, 53, 54, 55, 67–71, 77; 250/492.1, 492.2, 492.22, 493.1, 548
See application file for complete search history.

(56) References Cited

U.S. PATENT DOCUMENTS

| | | | |
|---|---|---|---|
| 6,238,852 B1 | 5/2001 | Klosner | |
| 6,285,488 B1 | 9/2001 | Sandstrom | |
| 6,312,134 B1 * | 11/2001 | Jain | ..................... G03F 7/70291 355/35 |
| 6,417,509 B1 * | 7/2002 | Atsuumi | .............. G02B 26/128 250/234 |

(Continued)

FOREIGN PATENT DOCUMENTS

| | | |
|---|---|---|
| KR | 1020090005860 | 1/2009 |
| KR | 1020120100208 | 9/2012 |

*Primary Examiner* — Christina Riddle
(74) *Attorney, Agent, or Firm* — F. Chau & Associates, LLC

(57) ABSTRACT

Provided is a digital exposure device. The digital exposure device includes a stage mounted with a substrate on which a pattern is formed, a first light source, a first head, and a digital micro-mirror device control unit. The stage is configured to move in a scan direction. The first light source is configured to provide a first light. The first head is spaced apart from the stage in a first direction and is configured to receive the first light, to generate at least one spot beam by modulating the first light, and to project the at least one spot beam onto the substrate. The digital micro-mirror device control unit is configured to control an energy of the at least one spot beam generated from the first head to be inversely proportional to a size of the at least spot beam generated from the first head.

19 Claims, 6 Drawing Sheets

(56) References Cited

U.S. PATENT DOCUMENTS

| | | |
|---|---|---|
| 6,428,940 B1 | 8/2002 | Sandstrom |
| 6,876,440 B1 | 4/2005 | Bleeker et al. |
| 7,187,399 B2 | 3/2007 | Noguchi et al. |
| 8,259,285 B2 | 9/2012 | Troost et al. |
| 2001/0045690 A1* | 11/2001 | Brandinger ......... B23K 26/032 264/400 |
| 2002/0005940 A1 | 1/2002 | Hatada et al. |
| 2005/0068509 A1 | 3/2005 | Latypov et al. |
| 2005/0270514 A1* | 12/2005 | Hahn ................. G03F 7/70291 355/67 |
| 2006/0012766 A1* | 1/2006 | Klosner ............. G03F 7/70291 355/67 |
| 2006/0147841 A1* | 7/2006 | Ohmi ................. G03F 7/70291 430/311 |
| 2009/0273793 A1* | 11/2009 | Fukuda ................ G03F 7/2053 356/614 |
| 2010/0208229 A1* | 8/2010 | Shin .................... G03F 7/70275 355/77 |
| 2010/0231985 A1* | 9/2010 | Kinjo ...................... G01D 1/00 358/474 |
| 2011/0199620 A1* | 8/2011 | Yun ....................... G01B 11/14 356/625 |
| 2011/0267594 A1 | 11/2011 | Kim et al. |

* cited by examiner

DIGITAL EXPOSURE DEVICE USING DIGITAL MICRO-MIRROR DEVICE AND A METHOD FOR CONTROLLING THE SAME

CROSS-REFERENCE TO RELATED APPLICATIONS

This application claims priority under 35 U.S.C. §119 to Korean Patent Application No. 10-2013-0080436, filed on Jul. 9, 2013, in the Korean Intellectual Property Office, the disclosure of which is incorporated by reference herein in its entirety.

TECHNICAL FIELD

The present disclosure herein relates to a digital exposure device and more particularly, to a digital exposure device using a digital micro-mirror device and a method of controlling the same.

DISCUSSION OF THE RELATED ART

A method of forming a pattern on a substrate configuring a liquid crystal display (LCD), a plasma display panel (PDP), or a flat panel display (FPD) may include coating a pattern material on a substrate at first, selectively exposing the pattern material by using a photo mask, and selectively removing a portion of the pattern material whose chemical property is changed or removing a portion other than the portion of the pattern material to form a pattern.

However, as a size of a substrate gets larger and more miniaturized pattern is required, a digital exposure device which does not require a photo mask to form a pattern on a substrate may be used. The digital exposure device may form a pattern by transferring optical beams including pattern information onto a substrate.

The digital exposure device may include a digital exposure device using a grating light value (GLV) and a digital exposure device using a digital micro-mirror device (DMD).

In the digital exposure using the DMD, a plurality of micro-mirrors may have a predetermined angle. Each of the micro-mirrors may selectively reflect an incident light with different angles, and accordingly, only the incident light reflected with a desired angle may be used for exposure.

SUMMARY

The present disclosure a digital exposure device using a digital micro-mirror device capable of forming a pattern whose width is controllable to be uniform in an overlapping area between adjacent heads and preventing a defective pattern from being generated.

The present disclosure also provides a method for controlling the digital exposure device using the digital micro-mirror device.

According to an embodiment of the inventive concept, a digital exposure device using a digital micro-mirror device is provided. The digital exposure device includes a stage mounted with a substrate on which a pattern is formed, a first light source, a first head, and a digital micro-mirror device control unit. The stage is configured to move in a scan direction. The first light source is configured to provide a first light. The first head is spaced apart from the stage in a first direction and is configured to receive the first light, to generate at least one spot beam by modulating the first light, and to project the at least one spot beam onto the substrate; and a digital micro-mirror device control unit is configured to control an energy of the at least one spot beam generated from the first head to be inversely proportional to a size of the at least one spot beam generated from the first head.

In an embodiment, the first head may include a digital micro-mirror device configured to selectively reflect the first light. The first digital micro-mirror device may include a plurality of micro-mirrors whose angles are separately controllable.

In an embodiment, the first head may include a first upper lens, a first micro-lens array, and a first lower lens. The first upper lens may be configured to magnify the first light reflected by the first digital micro-mirror device. The first micro-lens array may be configured to focus the first light magnified through the first upper lens to have a predetermined size. The first lower lens may be configured to adjust a resolution of the first light focused through the first micro-lens array.

In an embodiment, the at least one spot beam generated from the first head may include a first spot beam and a second spot beam having different sizes. The digital micro-mirror device control unit may be configured to control an energy of the first spot beam and an energy of the second spot beam to be different from each other.

In an embodiment, a multiplication of a size of the first spot beam and an energy of the first spot beam may be substantially equal to a multiplication of a size of the second spot beam and an energy of the second spot beam.

In an embodiment, the digital micro-mirror device control unit may be configured to control the number of micro-mirrors turned on to form the first spot beam to be different from the number of micro-mirrors turned on to form the second spot beam.

In an embodiment, the digital exposure device may further include a second light source and a second head. The second light source may be spaced apart from the first light source and configured to provide a second light. The second head may be configured to receive the second light, to generate at least one spot beam, and to project the at least one spot beam onto the substrate on which a pattern is formed. The digital micro-mirror device control unit may be configured to control an energy of the at least one spot beam generated from the second head to be inversely proportional to a size of the at least one spot beam generated from the second head.

In an embodiment, the second head may include a second digital micro-mirror device configured to selectively reflect the second light. The second digital micro-mirror device may include a plurality of micro-mirrors whose angles are separately controllable.

In an embodiment, the second head may include a second upper lens, a second micro-lens array, and a second lower lens. The second upper lens may be configured to magnify the second light reflected by the second digital micro-mirror device. The second micro-lens array may be configured to focus the second light magnified through the second upper lens to have a predetermined size. The second lower lens may be configured to adjust a resolution of the second light focused through the second micro-lens array.

In an embodiment, the first digital micro-mirror device and the second digital micro-mirror device may have an overlapping area in the scan direction.

In an embodiment, a difference in size between the spot beam generated from the first head and the at least one spot beam generated from the second head may be less than about 100 nm in the overlapping area.

In an embodiment, the first head and the second head may be disposed in order in the first direction and a second direction vertical to the scan direction. The difference in size between a last spot beam in the second direction generated from the first head and a first spot beam in the second direction generated from the second head may be less than about 100 nm.

In an embodiment, the digital micro-mirror device control unit may be to separately control the energy of the at least one spot beam generated from the first head and the energy of the at least one spot beam generated from the second head.

According to an embodiment of the inventive concept, a method for controlling a digital exposure device using a digital micro-mirror device is provided. The method includes arranging a first head and a second head to make a difference in size between at least one spot beam generated from the first head and at least one spot beam generated from the second head to be less than about 100 nm in an overlapping area of the first head and the second head. The method further includes controlling an energy of the at least one spot beam generated from each of the first head and the second head to be inversely proportional to the size of the at least one spot beam generated from each of the first head and the second head.

In an embodiment, the energy of the at least one spot beam generated from each of the first head and the second head may be controlled by controlling the number of micro-mirrors turned on to form the at least one spot beam generated from each of the first head and the second head.

In an embodiment, a multiplication of the energy of the at least one spot beam generated from each of the first head and the second head and the size of the at least one spot beam generated from each of the first head and the second head may be controlled to be constant.

In an embodiment, the energy of the at least one spot beam generated from the first head and the energy of the at least one spot beam generated from the second head may be separately controlled.

According to an embodiment of the inventive concept, a digital exposure device is provided. The digital exposure device includes a plurality of heads spaced apart from each other and a digital micro-mirror device control unit configured to control the plurality of heads. Each of the plurality of heads includes a digital micro-mirror device having a plurality of micro-mirrors. The digital micro-mirror device control unit is configured to control the digital micro-mirror device to turn on and off separately each of the plurality of micro-mirrors.

In an embodiment, the digital micro-mirror device control unit may be configured to control an energy of the at least one spot beam generated from each of the plurality of heads to be inversely proportional to a size of the at least one spot beam generated from each of the plurality of heads.

In an embodiment, the multiplication of an energy and a size of each of the at least one spot beam generated from each of the plurality of heads may be controlled to be constant.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

Exemplary embodiments of the inventive concept will be described below in more detail with reference to the accompanying drawings. The inventive concept may, however, be embodied in different forms and should not be construed as limited to the embodiments set forth herein.

Hereinafter, exemplary embodiments of the inventive concept may be described in detail with reference to the accompanying drawings.

Figure 1:
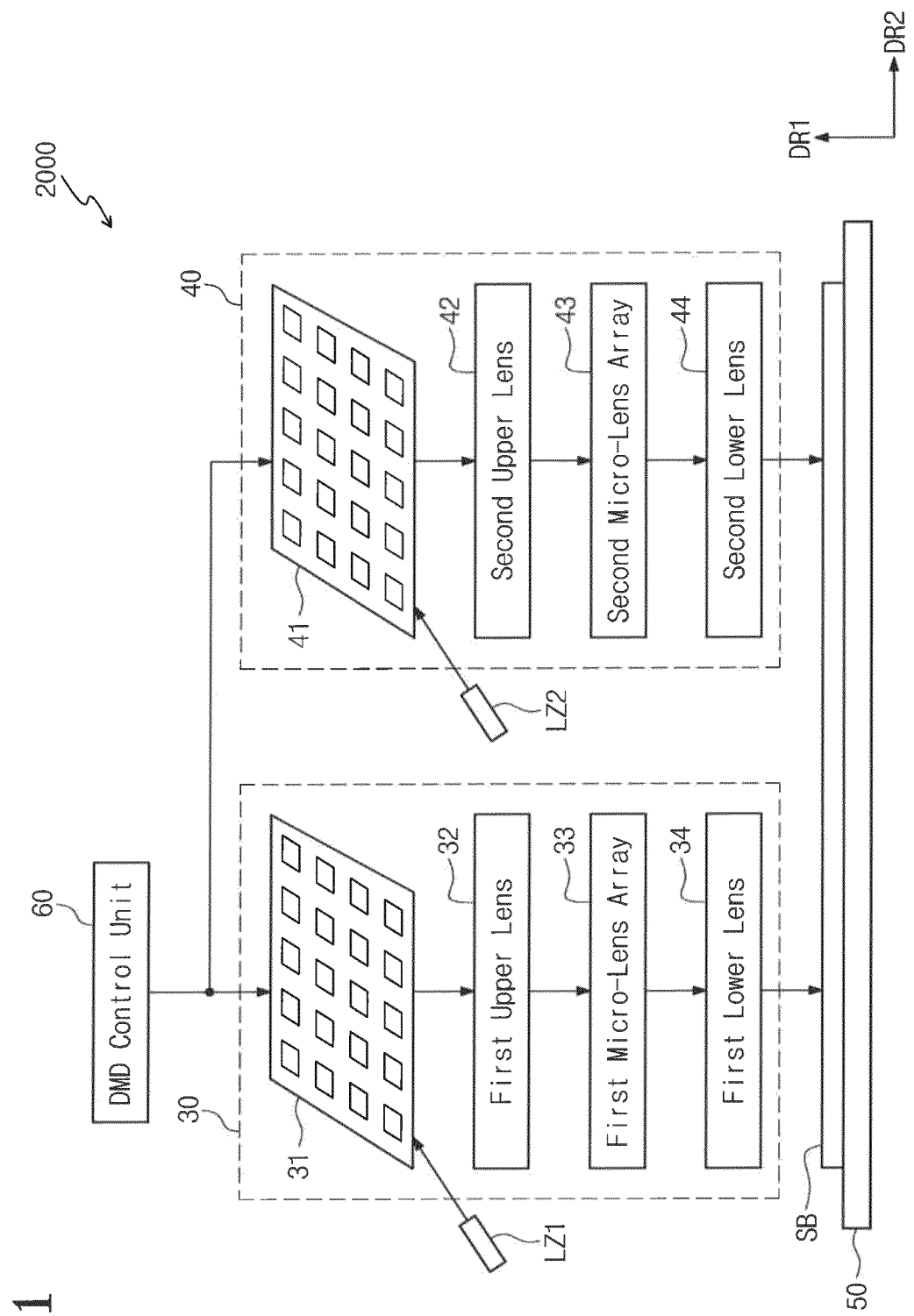
FIG. 1 is a view illustrating a digital exposure device using a digital micro-mirror device (DMD) according to an embodiment of the inventive concept.

FIG. 1 is a view illustrating a digital exposure device 2000 using a digital micro-mirror device (DMD) according to an embodiment of the inventive concept.

Referring to FIG. 1, the digital exposure device 2000 using a DMD may include a first light source LZ1, a second light source LZ2, a first head 30, a second head 40, a stage 50, and a DMD control unit 60.

The first light source LZ1 may provide a laser light to the first head. The second light source 122 may be spaced apart from the first light source LZ1 and may provide a laser light to the second head 40. The first light source LZ1 and the second light source LZ2 may control an intensity of a laser light through a light source control unit (not shown).

The stage 50 may be disposed below the first head 30 and the second head 40 in a first direction DR1. A substrate SB mounted on one surface of the stage 50. The substrate SB may be an object on which a pattern is formed. The substrate SB may be a wafer or a glass. However, the substrate SB is not limited thereto.

The stage 50 may move in a scan direction vertical to the first direction DR1 and a second direction DR2. As the stage 50 moves, the first head 30 and the second head 40 may scan from one side to the other side of the substrate SB.

The first head 30 may receive the laser light provided from the first light source LZ1, generate spot beams by modulating the laser light, and project the generated spot beams onto the substrate SB. The first head 30 to modulate the laser light provided from the first light source LZ1 may include a first DMD 31, a first upper lens 32, a first micro lens array 33, and a first lower lens 34.

The first DMD 31 may include a plurality of micro-mirrors whose angles are separately controllable. Each of the plurality of micro-mirrors may be turned on/off according to design data provided from the outside, and thus, the provided laser light may be reflected selectively. When a micro-mirror is turned on, the laser light provided to the first DMD 31 may be reflected with a desired angle by the micro-mirror, and thus may be provided to the first upper lens 32. When the micro-mirror is turned off, the laser light provided to the first DMD 31 may be reflected with another angle by the micro-mirror, and thus may not be provided to the first upper lens 32. Each of the micro-mirror may have different angles from each other with respect to a plane parallel to the stage 50 as each of the micro-mirror turns on and off.

The first upper lens 32, the first micro lens array 33, and the first lower lens 34 are disposed in order between the first DMD 31 and the stage 50.

The turned-on micro-mirror may reflect the laser light and provide the laser light to the first upper lens 32. The first upper lens 32 may magnify the laser light reflected through the turned-on micro-mirror. The first micro lens array 33 may focus the laser light through the first upper lens 32 to have a predetermined size. The first lower lens 34 may adjust a resolution of the first light focused through the first micro lens array 33, and thus, the laser light through the first lower lens 34 may be projected onto the substrate SB.

The second head 40 may be spaced apart from the first head 30, and may modulate the laser light provided from the second light source LZ2, and may project the modulated laser light onto the substrate SB. The second head 40 may include a second DMD 41, a second upper lens 42, a second micro lens army 43, and a second lower lens 44.

Since the elements of the second head 40 (e.g., the second DMD 41, the second upper lens 42, the second micro lens array 43, and the second lower lens 44) are functionally equivalent to those of the first DMD 31, the first upper lens 32, the first micro lens array 33, and the first lower lens 34, respectively, a description of the similar features may be omitted.

The larger the substrate SB becomes, more number of heads are required to expose the substrate SB through a single scanning operation. Although only two heads (e.g., the first head 30 and the second head 40) are shown in FIG. 1 for simplicity, the inventive concept is not limited thereto. For example, at least three heads may be provided.

The DMD control unit 60 may separately turn on/off each of the micro-mirrors in the first DMD 31 and the second DMD 41. A detailed description for the DMD control unit 60 may be shown later.

Figure 2:
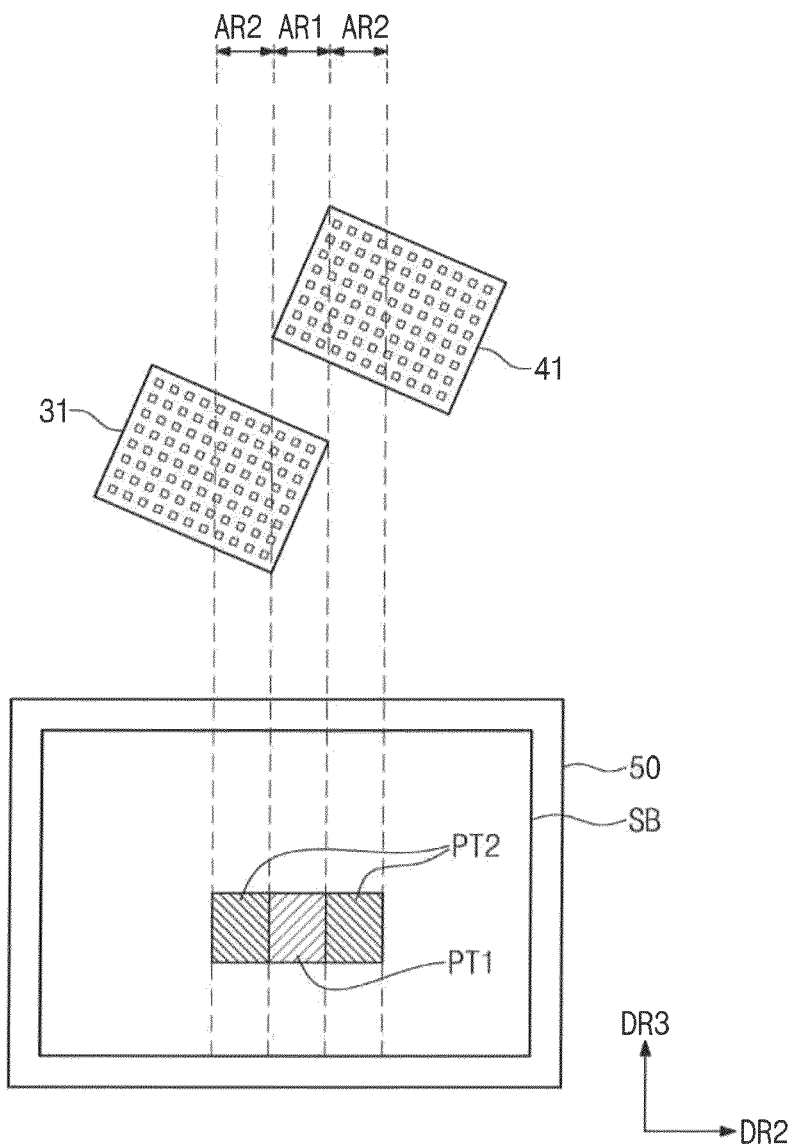
FIG. 2 is a view illustrating a process of forming a pattern through the first DMD and the second DMD of FIG. 1.

FIG. 2 is a view illustrating a process of forming a pattern through the first DMD and the second DMD of FIG. 1.

Referring to FIG. 2, the first DMD 31 and the second DMD 41 may be arranged tilted with a predetermined angle with respect to a plane parallel to the substrate SB. This is to reduce a control width, in the second direction DR2, of a pattern that is to be formed on the substrate SB.

The first DMD 31 and the second DMD 41 may partially be arranged to overlap in the scan direction DR3. An area where the first DMD 31 and the second DMD 32 overlap is defined as an overlapping area AR1. An area where the first DMD 31 and the second DMD 41 do not overlap is defined as a non-overlapping area. An adjacent area AR2 is defined in the non-overlapping area. The adjacent area AR2 is adjacent to the overlapping area AR1. The width of the adjacent area AR2 in the second direction DR2 is substantially identical to the width of the overlapping area AR1.

An area occupied by the first DMD 31 and the second DMD 41 in the overlapping area AR1 may be equal to an area occupied by either the first DMD 31 or the second DMD 41 in the adjacent area AR2. The overlapping area AR1 may be occupied equally by the first DMD 31 and the second DMD 41. For example, if an area occupied by either the first DMD 31 or the second DMD 41 in the adjacent area AR2 is 1, an area occupied by the first DMD 31 in the overlapping area AR1 is about 0.5, and an area occupied by the second DMD 41 in the overlapping area AR1 is also 0.5.

In an ideal case, there should be no difference in quality between a pattern PT1 formed through the overlapping area AR1 and a pattern PT2 formed through the adjacent area AR2. However, practically the sizes, positions, and energies of spot beams formed by the first DMD 31 and the second DMD 41 may be different, unlike the ideal case, and accordingly, the pattern PT1 formed through the overlapping area AR1 may be different from the pattern PT2 formed through the adjacent area AR2. This different pattern may be viewed as a stain or a stitch.

Figure 3:
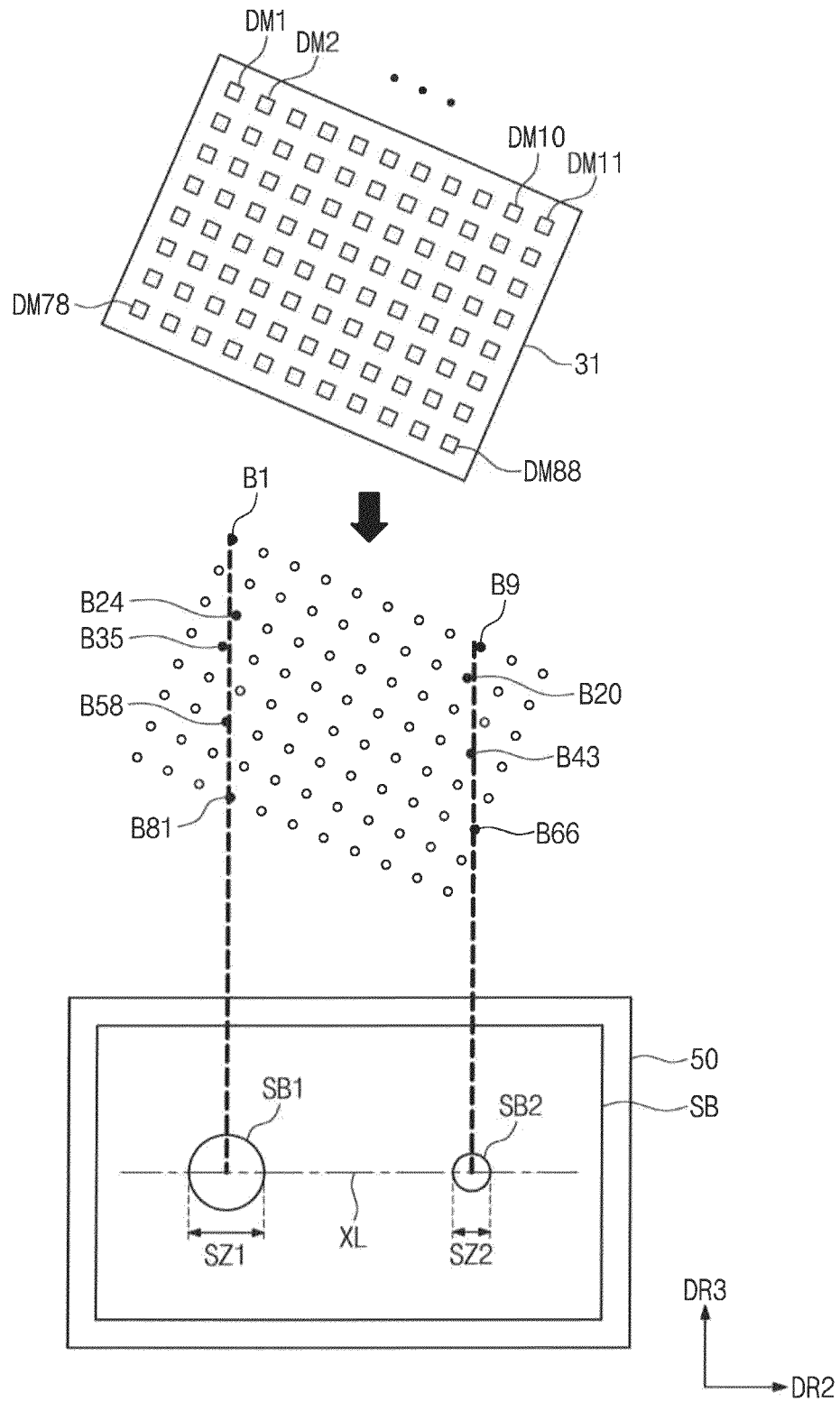
FIG. 3 is a view illustrating spot beams generated from the first head of FIG. 1.

FIG. 3 is a view illustrating a spot beam generated from the first head 30 of FIG. 1.

Referring to FIG. 3, the first DMD 31 may include 11×8 micro-mirrors DM1 to DM88. The 11×8 micro-mirrors DM1 to DM88 may be all turned on as shown in FIG. 3.

Referring to FIGS. 1 and 3, a laser light incident from the first light source LZ1 may be reflected by the first DMD 31 and modulated as it passes through the first upper lens 32, the first micro lens array 33, and the first lower lens 34. The laser light passing through the first lower lens 34 may be projected onto the substrate SB. The laser light passing through the first lower lens 34 may be defined as a plurality of beams B1 to B88. The beams B1 to B88 may be reflected by the micro-mirrors DM1 to DM88, respectively, and modulated by the first upper lens 32, the first micro lens array 33, and the first lower lens 34.

Among the plurality of beams B1 to B88, beams overlapping in a line parallel to the scan direction DR3 may form a spot beam focused on the substrate SB.

For example, as shown in FIG. 3, a first spot beam SB1 may be formed by a first beam B1, a twenty fourth beam B24, a thirty fifth beam B35, a fifty eighth beam B58, and an eighty first beam B81. A second spot beam SB2 formed by a ninth beam B9, a twentieth beam B20, a forty third beam B43, and a sixty sixth beam B66.

The first spot beam SB1 and the second spot beam SB2 may be focused on the same line XL parallel to the second direction DR2 to be exposed on the substrate SB simultaneously.

As shown in FIG. 3, a size SZ1 of the first spot beam SB1 may be different from a size SZ2 of the second spot beam SB2, although they are generated from the same first DM 31. There may be various reasons in making the sizes of the spot beams different. For example, when the first DMD 31 is expanded by heat, it may be misaligned with the first micro lens array 33. Although the size SZ1 of the first spot beam SB1 is greater than the size SZ2 of the second spot beam SB2 as shown in FIG. 3, the inventive concept is not limited thereto. If necessary, the size SZ1 of the first spot beam SB1 may be the same as, or less than the size SZ2 of the second spot beam SB2. Moreover, although not shown in the drawings, due to similar reasons, an average size of spot beams generated from the first head 30 may be different from an average size of spot beams generated from the second head 40.

Figure 4:
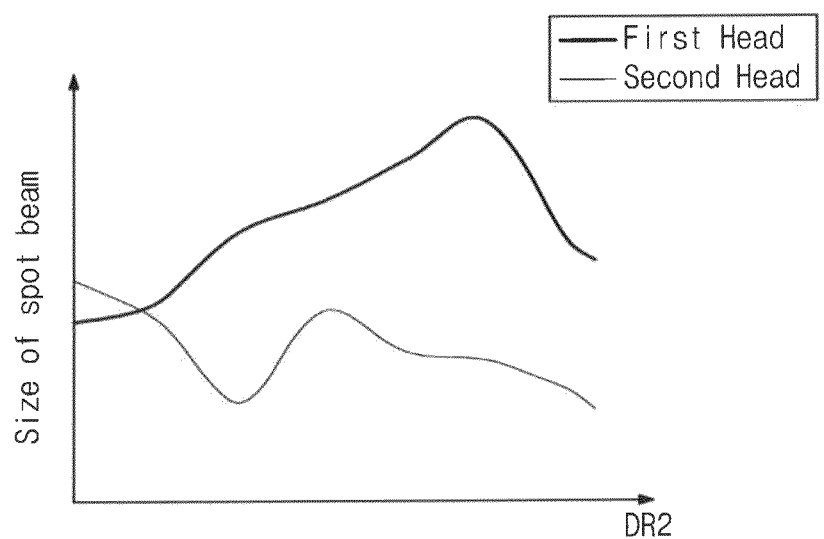
FIG. 4 is a graph illustrating sizes of spot beams, varying along a second direction, generated from a first head and a second head of FIG. 1.

FIG. 4 is a graph illustrating sizes of the spot beams, varying along the second direction DR2, generated from the first head and the second head of FIG. 1.

Referring to FIGS. 3 and 4, the sizes of the spot beams generated from each of the first head 30 and the second head 40 may vary along the second direction DR2. The variation of the sizes of the spot beams generated from the first head 30 may be different from that of the sizes of the spot beams generated from the second head 40.

Figure 5:
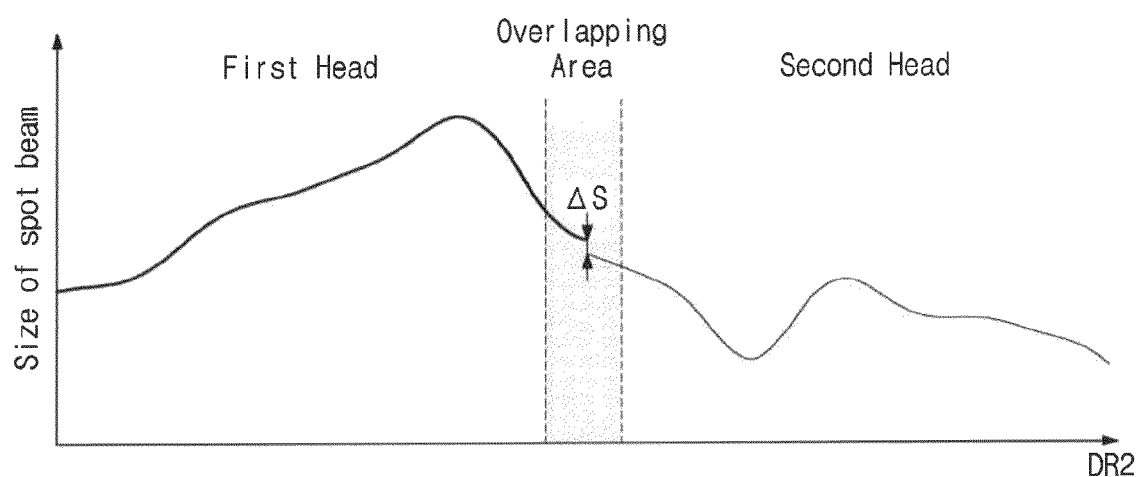
FIG. 5 is a view illustrating a difference in size between a spot beam generated from a first head and a spot beam generated from a second head according to an arranged position of the first head and the second head.

FIG. 5 is a view illustrating a difference in size of a spot beam generated from a first head and a spot beam generated from a second head according to an arranged position of the first head and the second head.

Referring to FIG. 5, the first head 30 and the second head 40 may be arranged in a position at which there exist a difference ΔS in size between a spot beam generated from the first head 30 and a spot beam generated from the second head 40. The difference ΔS may be less than about 100 nm in an overlapping area AR1 of the first head 30 and the second head 40. For example, a difference in size between the last spot beam in the second direction DR2 generated from the first head 30 and the first spot beam in the second direction DR2 generated from the second head 40 may be less than about 100 nm.

When a difference in size between the spot beams generated from adjacent heads is greater than about 100 nm in the overlapping area of the adjacent heads, a stitch may be seen in a pattern formed through the overlapping area. According to an embodiment of the inventive concept, to prevent a stitch from being generated, a difference in size between two adjacent spot beams generated from the first head 30 and the second head 40 may be less than about 100 nm in the overlapping area AR1 of the first head 30 and the second head 40.

In this embodiment, although the first head 30 and the second head 40 are described as an example, the substantially same operating concept may be applied to a digital exposure device including more than two heads according to an embodiment of the inventive concept. For example, in a digital exposure device including three heads, when the digital exposure device arranges a first head, a second head, and third head in order in the second direction DR2, the last spot beam generated from the first head and the first spot beam generated from the second head may have a different size of less than about 100 nm. The last spot beam in the second direction DR2 generated from the second head and the first spot beam in the second direction DR2 generated from the third head may have a difference in size of less than about 100 nm.

Figure 6:
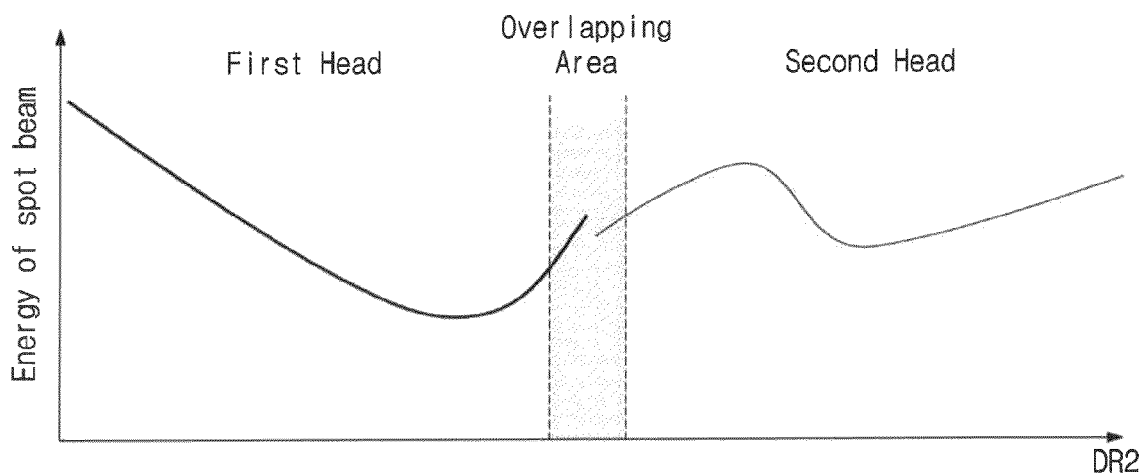
FIG. 6 is a view illustrating energies of spot beams, varying along a second direction DR2, generated from the first head and the second head of FIG. 3.

FIG. 6 is a view illustrating energies of spot beams, along the second direction DR2, generated from the first head 30 and the second head 40 of FIG. 3.

Referring to FIGS. 3, 5, and 6, a width of a pattern, in the second direction DR2, formed on the substrate SB may be determined by a multiplication of a size of a spot beam and an energy of the spot beam. Accordingly, in order to make the width of the pattern to be uniform, the multiplication of the size of the spot beam and the energy of the spot beam may need to be constant.

Each of the first head 30 and the second head 40 may control the energies of the spot beams to be inversely proportional to the sizes of the spot beams, and accordingly, that the width of the pattern formed on the substrate SB in the second direction DR2 may be maintained uniformly. Additionally, the energies of the spot beams generated from the first head 30 and the energies of the spot beams generated from the second head 40 may be controlled independently from each other, in order to make a width of a pattern formed by the first head 30 and a width of a pattern by the second head 40 to be equal.

Figure 7:
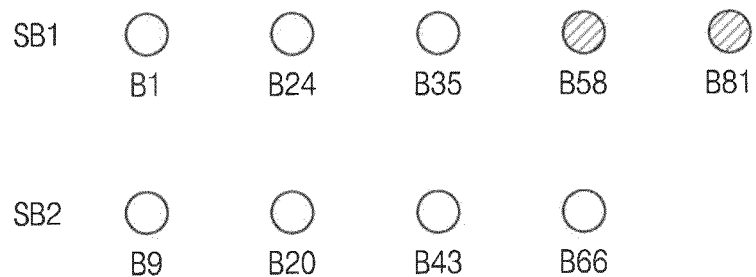
FIG. 7 is a view illustrating an operation of the DMD control unit of FIG. 1.

FIG. 7 is a view illustrating an operation of the DMD control unit of FIG. 1.

Referring to FIGS. 3 and 7, the DMD control unit 60 may turn on/off separately each of the micro-mirrors in the first DMD 31 and the second DMD 41, and thus, separately control an energy of a spot beam generated from the first head 30 and an energy of a spot beam generated from the second head 40.

Hereinafter, for example, a process for controlling each energy of the first spot beam SB1 and the second spot beam SB2 that are generated from the first head 30 and have different sizes may be described. Similar to the case of the first head 30, energies of the spot beams generated from the second head 40 may be controlled according to sizes of the spot beams generated from the second head 40. A description of similar features may be omitted.

When all micro-mirrors are turned on, the first spot beam SB1 may include a total of five beams such as the first beam B1, the twenty fourth beam B24, the thirty fifth beam B35, the fifth eighth beam B58, and the eighty first beam B81, and the second spot beam SB2 may include a total of four beams such as the ninth beam B9, the twentieth beam B20, the forty third beam B43, and the sixty sixth beam B66. Here, a size of each beam may vary, but the varying size of each beam may not be considered since an energy of a spot beam relates to the number of the beams.

The DMD control unit 60 may selectively turn on the micro-mirrors corresponding to the beams (e.g., a first beam B1, a twenty fourth beam B24, a thirty fifth beam B35, a fifty eighth beam B58, and an eighty first beam B81 for the first spot beam SB a ninth beam B9, a twentieth beam B20, a forty third beam B43, and a sixty sixth beam B66 for the second spot beam SB2) generating each of the first spot beam SB1 and the second spot beam SB2 and may turn off the rest of the micro-mirrors.

Referring to FIG. 3 again, the size of the first spot beam SB1 may be larger than that of the second spot beam SB2. Considering the larger size of the first spot beam SB1, the DMD control unit 60 may control the number of micro-mirrors that needs to be turned on to provide the beams generating the first spot beam SB1 to be less than the number of micro-mirrors that needs to be turned on to provide the beams generating the second spot beam SB2. Accordingly, the multiplication of the size of the first spot beam SB1 and the energy of the first spot beam SB1 may be equal to that of the size of the second spot beam SB2 and the energy of the second spot beam SB2.

For example, the DMD control unit 60 may turn off two micro-mirrors (i.e., the fifty eighth mirror DM58 and the eighty first micro-mirror DM81) among the first micro-mirror DM1, the twenty fourth micro-mirror DM24, the thirty fifth micro-mirror DM35, the fifty eighth micro-mirror DM58, and the eighty first micro-mirror DM81, and may turn on the remaining. The DMD control unit 60 may turn on all of the ninth micro-mirror DM9, the twentieth micro-mirror DM20, the forty third micro-mirror DM43, and the sixty sixth micro-mirror DM66. The first spot beam SB1 may be generated from the three beams to have an energy corresponding to the three number of beams, and the second spot beam SB2 may be generated from the four beams to have an energy corresponding to the four number of beams. However, the inventive concept is not limited thereto. When the number of the beams generating the first spot beam SB1 is less than the number of the beams generating the second spot beam SB2, the specific number of beams may vary depending on the sizes of the spot beams.

According to an embodiment of the inventive concept, a digital exposure device using a DMD may control a width of a pattern formed on a substrate by differently applying an energy of a spot beam according to a size of the spot beam. Further, a plurality of heads may be arranged in a position at which a difference in size between the spot beams generated from adjacent heads is less a predetermined value. As a result, a defective pattern may be prevented from being generated.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A digital exposure device comprising:
   a stage on which a substrate is seated, wherein the stage is configured to move in a scan direction;
   a first light source configured to provide a first light;
   a first head configured to receive the first light, to generate at least one spot beam by modulating the first light, and to project the at least one spot beam onto the substrate, wherein the first head is spaced apart from the stage in a first direction; and
   a digital micro-mirror device (DMD) control unit configured to control an energy of the at least one spot beam generated from the first head to be inversely proportional to a size of the at least one spot beam generated from the first head.

2. The digital exposure device of claim 1, wherein the first head comprises a first DMD configured to selectively reflect the first light, wherein the first DMD comprises a plurality of micro-mirrors whose angles are separately controllable.

3. The digital exposure device of claim 2, wherein the first head comprises:
   a first upper lens configured to magnify the first light reflected by the first DMD;
   a first micro-lens array configured to focus the first light magnified through the first upper lens to have a predetermined size; and
   a first lower lens configured to adjust a resolution of the first light focused through the first micro-lens array.

4. The digital exposure device of claim 2, wherein
   the at least one spot beam generated from the first head comprises a first spot beam and a second spot beam having different sizes,
   wherein the DMD control unit is configured to control an energy of the first spot beam and an energy of the second spot beam to be different from each other.

5. The digital exposure device of claim 4, wherein a multiplication of a size of the first spot beam and the energy of the first spot beam is substantially equal to a multiplication of a size of the second spot beam and the energy of the second spot beam.

6. The digital exposure device of claim 4, wherein the DMD control unit is configured to control the number of micro-mirrors turned on to form the first spot beam to be different from the number of micro-mirrors turned on to form the second spot beam.

7. The digital exposure device of claim 2, further comprising:
   a second light source configured to provide a second light; and
   a second head configured to receive the second light, to generate at least one spot beam by modulating the second light, and to project the at least one spot beam onto a substrate, wherein the second head is spaced apart from the second light source,
   wherein the DMD control unit is configured to control an energy of the at least one spot beam generated from the second head to be inversely proportional to a size of the at least one spot beam generated from the second head.

8. The digital exposure device of claim 7, wherein the second head comprises a second DMD configured to selectively reflect the second light, wherein the second DMD comprises a plurality of micro-mirrors whose angles are separately controllable.

9. The digital exposure device of claim 8, wherein the second head comprises:
   a second upper lens configured to magnify the second light reflected by the second DMD;
   a second micro-lens array configured to focus the second light magnified through the second upper lens to have a predetermined size; and
   a second lower lens configured to adjust a resolution of the second light focused through the second micro-lens array.

10. The digital exposure device of claim 8, wherein the first DMD and the second DMD have an overlapping area in the scan direction.

11. The digital exposure device of claim 10, wherein a difference in size between the at least one spot beam generated from the first head and the at least one spot beam generated from the second head is less than about 100 nm in the overlapping area.

12. The digital exposure device of claim 7, wherein
   the first head and the second head are disposed in order in the first direction and a second direction vertical to the scan direction; and
   a difference in size between a last spot beam in the second direction generated from the first head and a first spot beam in the second direction generated from the second head is less than about 100 nm.

13. The digital exposure device of claim 7, wherein the DMD control unit is configured to separately control the energy of the at least one spot beam generated from the first head and the energy of the at least one spot beam generated from the second head.

14. A method of controlling a digital exposure device, the method comprising:
   arranging a first head and a second head to make a difference in size at least one spot beam generated from the first head and at least one spot beam generated from the second head to be less than about 100 nm in an overlapping area of the first head and the second head; and
   controlling an energy of the at least one spot beam generated from each of the first head and the second head to be inversely proportional to the size of the at least one spot beam generated from each of the first head and the second head.

15. The method of claim 14, wherein the energy of the at least one spot beam is controlled by controlling the number of micro-mirrors turned on to form the at least one spot beam.

16. The method of claim 14, wherein a multiplication of the energy and the size of the at least one spot beam generated from each of the first head and the second head is controlled to be constant.

17. The method of claim 14, wherein the energy of the at least one spot beam generated from the first head and the energy of the at least one spot beam generated from the second head are separately controlled.

18. A digital exposure device comprising:
   a plurality of heads spaced apart from each other; and
   a digital micro-mirror device (DMD) control unit configured to control the plurality of heads,
   wherein each of the plurality of heads is configured to receive a light, to generate at least one spot beam by modulating the light, and to project the at least one spot beam onto a substrate,
   wherein each of the plurality of heads comprises a DMD including a plurality of micro-mirrors,
   wherein the DMD control unit is configured to control the DMD to separately turn on and of each of the plurality of micro-mirrors, wherein a DMD control unit is configured to control an energy of the at least one spot beam generated from each of the plurality of heads to be inversely proportional to a size of the at least one spot beam generated from each of the plurality of heads.

19. The digital exposure device of claim 18, wherein a multiplication of an energy and a size of each of the at least one spot beam generated from each of the plurality of heads is controlled to be constant.

* * * * *